(12) United States Patent
Väyrynen et al.

(10) Patent No.: US 10,741,403 B2
(45) Date of Patent: Aug. 11, 2020

(54) METHODS FOR FORMING A METALLIC FILM ON A SUBSTRATE BY CYCLICAL DEPOSITION AND RELATED SEMICONDUCTOR DEVICE STRUCTURES

(71) Applicant: ASM IP Holding B.V., Almere (NL)

(72) Inventors: Katja Väyrynen, Helsinki (FI); Mikko Ritala, Espoo (FI); Markku Leskelä, Espoo (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 16/674,894

(22) Filed: Nov. 5, 2019

(65) Prior Publication Data

US 2020/0083054 A1 Mar. 12, 2020

Related U.S. Application Data

(63) Continuation of application No. 16/396,475, filed on Apr. 26, 2019, now Pat. No. 10,468,262, which is a continuation of application No. 15/434,051, filed on Feb. 15, 2017, now Pat. No. 10,468,261.

(51) Int. Cl.
| | |
|---|---|
| *C23C 16/455* | (2006.01) |
| *H01L 21/285* | (2006.01) |
| *C23C 16/04* | (2006.01) |
| *C23C 16/18* | (2006.01) |
| *H01L 21/768* | (2006.01) |

(52) U.S. Cl.
CPC ...... *H01L 21/28556* (2013.01); *C23C 16/045* (2013.01); *C23C 16/18* (2013.01); *C23C 16/45527* (2013.01); *C23C 16/45553* (2013.01); *H01L 21/28562* (2013.01); *H01L 21/28568* (2013.01); *H01L 21/76873* (2013.01); *H01L 21/76879* (2013.01)

(58) Field of Classification Search
CPC ......... H01L 21/28556; H01L 21/76879; H01L 21/28568; C23C 16/45527; C23C 16/45553; C23C 16/06; C23C 16/18; C23C 16/045
See application file for complete search history.

(56) References Cited

U.S. PATENT DOCUMENTS

| | | | | |
|---|---|---|---|---|
| 2003/0201541 | A1* | 10/2003 | Kim | ........................ C23C 16/18 257/766 |
| 2013/0171818 | A1* | 7/2013 | Kim | ..................... H01L 21/285 438/664 |
| 2014/0234550 | A1* | 8/2014 | Winter | .............. C23C 16/45553 427/535 |

* cited by examiner

*Primary Examiner* — Selim U Ahmed
*Assistant Examiner* — Evan G Clinton
(74) *Attorney, Agent, or Firm* — Snell & Wilmer L.L.P.

(57) ABSTRACT

Methods for forming a metallic film on a substrate by cyclical deposition are provided. In some embodiments methods may include contacting the substrate with a first reactant comprising a non-halogen containing metal precursor comprising at least one of copper, nickel or cobalt and contacting the substrate with a second reactant comprising a hydrocarbon substituted hydrazine. In some embodiments related semiconductor device structures may include at least a portion of a metallic interconnect formed by cyclical deposition processes.

19 Claims, 4 Drawing Sheets

METHODS FOR FORMING A METALLIC FILM ON A SUBSTRATE BY CYCLICAL DEPOSITION AND RELATED SEMICONDUCTOR DEVICE STRUCTURES

CROSS-REFERENCE TO RELATED APPLICATIONS

This application is a continuation and claims priority to U.S. patent application Ser. No. 16/396,475 filed Apr. 26, 2019 titled METHODS FOR FORMING A METALLIC FILM ON A SUBSTRATE BY A CYCLICAL DEPOSITION AND RELATED SEMICONDUCTOR DEVICE STRUCTURES; which is a continuation of and claims priority to U.S. patent application Ser. No. 15/434,051, filed on Feb. 15, 2017, titled METHODS FOR FORMING A METALLIC FILM ON A SUBSTRATE BY A CYCLICAL DEPOSITION AND RELATED SEMICONDUCTOR DEVICE STRUCTURES, the disclosures of which are hereby incorporated by reference in their entirety.

PARTIES OF JOINT RESEARCH AGREEMENT

The invention claimed herein was made by, or on behalf of, and/or in connection with a join research agreement between the University of Helsinki and ASM Microchemistry Oy. The agreement was in effect on and before the date the claimed invention was made, and the claimed invention was made as a result of activities undertaken within the scope of the agreement.

BACKGROUND

Field of the Invention

The present disclosure relates generally to methods for forming a metallic film on a substrate by cyclical deposition and in particular for forming metallic films comprising at least one of copper, cobalt and nickel. The disclosure also relates to semiconductor device structures including a metallic film formed by cyclical deposition.

Description of the Related Art

Metallic films, such as metallic films comprising copper, cobalt and nickel may be utilized in the fabrication of semiconductor device structures. For example, copper has become the primary interconnect material in microelectronic devices due to the low resistivity and high resistance to electromigration exhibited by copper films. Copper interconnects may be fabricated by a two-step process wherein a copper seed layer is first formed by physical vapor deposition (PVD) followed by a subsequent copper fill process performed by an electrodeposition process. However, the development of next generation microelectronic devices depends on the downscaling of semiconductor device feature sizes. Therefore, the copper seed layer may be required to be an extremely thin film which not only exhibits a low resistivity but which can also be formed in a conformal manner.

Due to the limited conformality inherent in PVD techniques, a more suitable deposition process may be required for the conformal deposition of metallic films for utilization in the fabrication of semiconductor device structures, such as, for example, for the formation of copper seed layers. A cyclical deposition, for example, atomic layer deposition processes may be utilized for forming conformal metallic films by alternating the supply of two or more gaseous precursors for reaction at a substrate surface. The reaction steps making up the atomic layer deposition process may be self-limited which enables the deposition of uniform and conformal metallic films with an atomic level of accuracy.

As an example, cyclical deposition of copper for fabrication of semiconductor device structures has been studied and may utilize precursors comprising copper chloride (CuCl), zinc (Zn) and hydrogen ($H_2$). However, the deposition of high-quality copper films at low temperatures has proven to be a challenging problem. Low deposition temperatures may be utilized in cyclical deposition, such as atomic layer deposition processes to suppress agglomeration and enable the deposition of thin, continuous films of copper. However, the vast majority of copper ALD processes require high temperature deposition techniques, with lower temperature processes principally being achieved by plasma enhanced processes which may lead to deterioration of the substrate and poor conformal coverage.

Methods and semiconductor device structures are therefore desirable that are able to deposit metallic films at a reduced deposition temperature, the deposition process being capable of providing a high-quality conformal metallic films.

SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, methods for forming a metallic film on a substrate by cyclical deposition are provided. The methods may comprise contacting the substrate with a first reactant comprising a non-halogen containing metal precursor comprising at least one of copper, nickel or cobalt and contacting the substrate with a second reactant comprising a hydrocarbon substituted hydrazine precursor.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

DETAILED DESCRIPTION

Figure 1:
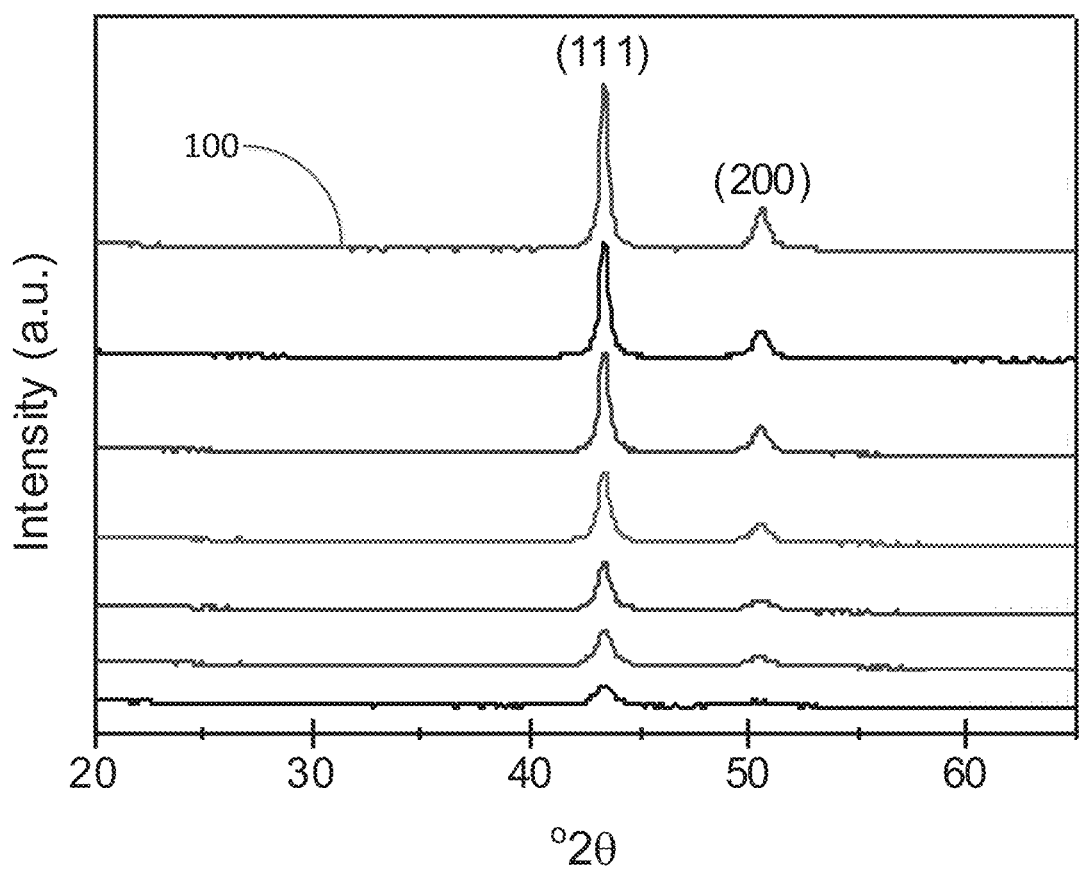
FIG. 1 is a graph showing x-ray diffraction (XRD) scans of copper films formed according to the embodiments of the disclosure.

The illustrations presented herein are not meant to be actual view of any particular material, structure, or device, but are merely idealized representations that are used to describe embodiments of the disclosure.

As used herein, the term "cyclic deposition" may refer to the sequential introduction of precursors (reactants) into a reaction chamber to deposit a layer over a substrate and includes processing techniques such as atomic layer deposition and cyclical chemical vapor deposition.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "cyclical chemical vapor deposition" may refer to any process wherein a substrate is sequentially exposed to two or more volatile precursors, which react and/or decompose on a substrate to produce a desired deposition.

As used herein, the term "substrate" may refer to any underlying material or materials that may be used, or upon which a device, a circuit or a film may be formed.

As used herein, the term "hydrocarbon substituted hydrazine" may refer to a derivative of hydrazine ($N_2H_4$) which may comprise at least one hydrocarbon substituted group.

As used herein, the term "non-halogen containing metal precursor" may refer to a metal precursor substantially free of halogen species.

The present disclosure includes methods for forming a metallic film on a substrate by a cyclical deposition process and the semiconductor device structures themselves that include a metallic film formed by the cyclical deposition process. The methods of disclosure may include methods for cyclical deposition of metallic films, such as, for example, copper, cobalt and nickel. The disclosure may also include utilizing the metallic film, such as copper, as at least a portion of a metallic interconnect. The disclosure may also include methods for forming a metallic film with reduced electrical resistivity and desirable crystallographic properties. Examples of such methods and semiconductor devices structures are disclosed in further detail below.

A non-limiting example embodiment of a cyclical deposition process may include ALD, wherein ALD is based on typically self-limiting reactions, whereby sequential and alternating pulses of reactants are used to deposit about one atomic (or molecular) monolayer of material per deposition cycle. The deposition conditions and precursors are typically selected to provide self-saturating reactions, such that an adsorbed layer of one reactant leaves a surface termination that is non-reactive with the gas phase reactants of the same reactant. The substrate is subsequently contacted with a different reactant that reacts with the previous termination to enable continued deposition. Thus, each cycle of alternated pulses typically leaves no more than about one monolayer of the desired material. However, as mentioned above, the skilled artisan will recognize that in one or more ALD cycles more than one monolayer of material may be deposited, for example if some gas phase reactions occur despite the alternating nature of the process.

In an ALD-type process for depositing metallic films, one deposition cycle may comprise exposing the substrate to a first reactant, removing any unreacted first reactant and reaction byproducts from the reaction space and exposing the substrate to a second reactant, followed by a second removal step. The first reactant may comprise a non-halogen containing metal precursor and the second reactant may comprise a hydrocarbon substituted hydrazine precursor.

Precursors may be separated by inert gases, such as argon (Ar) or nitrogen ($N_2$), to prevent gas-phase reactions between reactants and enable self-saturating surface reactions. In some embodiments, however, the substrate may be moved to separately contact a first vapor phase reactant and a second vapor phase reactant. Because the reactions self-saturate, strict temperature control of the substrates and precise dosage control of the precursors is not usually required. However, the substrate temperature is preferably such that an incident gas species does not condense into monolayers nor decompose on the surface. Surplus chemicals and reaction byproducts, if any, are removed from the substrate surface, such as by purging the reaction space or by moving the substrate, before the substrate is contacted with the next reactive chemical. Undesired gaseous molecules can be effectively expelled from a reaction space with the help of an inert purging gas. A vacuum pump may be used to assist in the purging.

According to some embodiments, ALD processes are used to form metallic films on a substrate, such as an integrated circuit workpiece. In some embodiments of the disclosure each ALD cycle comprises two distinct deposition steps or phases. In a first phase of the deposition cycle ("the metal phase"), the substrate surface on which deposition is desired is contacted with a first vapor phase reactant comprising a metal precursor which chemisorbs onto the substrate surface, forming no more than about one monolayer of reactant species on the surface of the substrate.

Reactors capable of being used to grow thin films can be used for the deposition. Such reactors include ALD reactors, as well as CVD reactors equipped with appropriate equipment and means for providing the precursors. According to some embodiments, a showerhead reactor may be used.

Examples of suitable reactors that may be used include commercially available single substrate (or single wafer) deposition equipment such as Pulsar® reactors (such as the Pulsar® 2000 and the Pulsar® 3000 and Pulsar® XP ALD), and EmerALD® XP and the EmerALD® reactors, available from ASM America, Inc. of Phoenix, Ariz. and ASM Europe B.V., Almere, Netherlands. Other commercially available reactors include those from ASM Japan K.K (Tokyo, Japan) under the tradename Eagle® XP and XP8. In some embodiments the reactor is a spatial ALD reactor, in which the substrates moves or rotates during processing.

In some embodiments a batch reactor may be used. Suitable batch reactors include, but are not limited to, Advance® 400 Series reactors commercially available from and ASM Europe B.V (Almere, Netherlands) under the trade names A400 and A412 PLUS. In some embodiments a vertical batch reactor is utilized in which the boat rotates during processing, such as the A412. Thus, in some embodiments the wafers rotate during processing. In other embodiments, the batch reactor comprises a minibatch reactor configured to accommodate 10 or fewer wafers, 8 or fewer wafers, 6 or fewer wafers, 4 or fewer wafers, or 2 wafers. In some embodiments in which a batch reactor is used, wafer-to-wafer uniformity is less than 3% (1sigma), less than 2%, less than 1% or even less than 0.5%.

The deposition processes described herein can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run. Additionally, in a cluster tool it is possible to reduce the time to pump the reaction space to the desired process pressure levels between substrates.

A stand-alone reactor can be equipped with a load-lock. In that case, it is not necessary to cool down the reaction space between each run. In some embodiments a deposition process for depositing a thin film comprising metallic film may comprise a plurality of deposition cycles, for example ALD cycles.

In some embodiments the cyclical deposition process are used to form metallic films on a substrate and the cyclical deposition process may be an ALD type process. In some embodiments the cyclical deposition may be a hybrid ALD/CVD or cyclical CVD process. For example, in some embodiments the growth rate of the ALD process may be low compared with a CVD process. One approach to increase the growth rate may be that of operating at a higher substrate temperature than that typically employed in an ALD process, resulting in a chemical vapor deposition process, but still taking advantage of the sequential introduction of precursors, such a process may be referred to as cyclical CVD.

In some embodiments, the metal precursor, also referred to herein as the "metal compound" may comprise a non-halogen containing metal precursor, i.e., the metal precursor may be substantially free of halogen species. In some embodiments, the non-halogen containing metal precursor may comprise one of copper, cobalt and nickel. The non-halogen containing metal precursor may therefore comprise at least one of $Cu(dmap)_2$ (dmap=dimethylamino-2-propoxide), $Ni(dmap)_2$ or $Co(dmap)_2$. In some embodiments the non-halogen containing metal precursor may therefore comprise at least one bidentate ligand in which the metal center atom is bonded through at least one oxygen and at least one nitrogen atom in the bidentate ligand. In some embodiments the non-halogen containing metal precursor may therefore comprise at least one bidentate ligand in which the metal center atom is bonded through at least one nitrogen atom in the bidentate ligand. In some embodiments the non-halogen containing metal precursor may therefore comprise at least one bidentate ligand and at least one other ligand, such as monodentate ligand. In some embodiments the non-halogen containing metal precursor may therefore comprise at least one bidentate ligand and at least two other ligands, such as monodentate ligands. In some embodiments the non-halogen containing metal precursor may therefore comprise at least one bidentate ligand and at least one other ligand, such as monodentate ligand, which is bonded through N or O to the metal center atom. In some embodiments the non-halogen containing metal precursor may therefore comprise at least one bidentate ligand in which the metal center atom is bonded through at least one nitrogen atom and bonded through at least one other atom than nitrogen in the bidentate ligand. In some embodiments the non-halogen containing metal precursor may therefore comprise at least one bidentate ligand in which the metal center atom is bonded through at two nitrogen atoms in the bidentate ligand. In some embodiments the non-halogen containing metal precursor comprises at least two bidentate ligands. In some embodiments the non-halogen containing metal precursor includes two bidentate ligands. Some examples of suitable non-halide containing betadiketiminato (e.g., $Ni(pda)_2$), (pda=pentane-2,4-diketiminato) compounds are mentioned in U.S. Patent Publication No. 2009-0197411 A1, the disclosure of which is incorporated herein in its entirety. Some examples of suitable non-halide containing amidinate compounds (e.g., $Ni(iPr-AMD)_2$) are mentioned in U.S. Patent Publication No. 2006-0141155 A1, the disclosure of which is incorporated herein in its entirety. Some examples of suitable non-halide containing iminoalkoxide compounds are mentioned in U.S. Patent Publication No. 2014-0227444 A1, the disclosure of which is incorporated herein in its entirety. In some embodiments the non-halogen containing metal precursor does not comprise other metal atoms than the desired metal (Co, Ni, Cu). In some embodiments the metal in the non-halogen containing metal precursor has oxidation state of 0. In some embodiments the metal in the non-halogen containing metal precursor has oxidation state of +I. In some embodiments the metal in the non-halogen containing metal precursor has oxidation state of +III. In some embodiments the metal in the non-halogen containing metal precursor has oxidation state of +II. In some embodiments the oxidation state is the oxidation state of the metal in the precursor at room temperature. The oxidation state may change in different conditions, such as in different pressures, temperatures and/or atmospheres as well as when contacted with different surface materials at the said different conditions. In some embodiments the non-halogen containing metal precursor does not comprise halides, such as F, Cl, Br or I. In some embodiments the non-halogen containing metal precursor comprises carbon, hydrogen and nitrogen and optionally oxygen.

In some embodiments the non-halide containing copper precursor may comprise, for example, $Cu(dmap)_2$ or copper (I) N,N'-diisopropylacetamidinate. In some embodiments, copper precursors can be selected from the group consisting of copper betadiketonate compounds, copper betadiketiminato compounds, copper aminoalkoxide compounds, such as $Cu(dmae)_2$, $Cu(deap)_2$ or $Cu(dmamb)_2$, copper amidinate compounds, such as $Cu(^sBu-amd)]_2$, copper cyclopentadienyl compounds, copper carbonyl compounds and combinations thereof. In some embodiments, $X(acac)_y$ or $X(thd)_y$ compounds are used, where X is copper, y is generally, but not necessarily 2 or 3 and thd is 2,2,6,6-tetramethyl-3,5-heptanedionato. In some embodiments the non-halide containing copper precursor is copper(II)acetate, [Cu(HMDS)]4 or Cu(nhc)HMDS (1,3-di-isopropyl-imidazolin-2-ylidene copper hexamethyl disilazide) or Cu-betadiketiminates, such as Cu(dki)VTMS (dki=diketiminate).

In some embodiments the non-halide containing nickel precursor may be, for example, bis(4-N-ethylamino-3-penten-2-N-ethyliminato)nickel (II). In some embodiments, nickel precursors can be selected from the group consisting of nickel betadiketonate compounds, nickel betadiketiminato compounds, nickel aminoalkoxide compounds, nickel amidinate compounds, nickel cyclopentadienyl compounds, nickel carbonyl compounds and combinations thereof. In some embodiments, X(acac)$_y$ or X(thd)$_y$ compounds are used, where X is nickel, y is generally, but not necessarily 2 or 3 and thd is 2,2,6,6-tetramethyl-3,5-heptanedionato.

In some embodiments the Co precursor is a Co beta-diketoiminato compound. In some embodiments the Co precursor is a Co ketoiminate compound. In some embodiments the Co precursor is a Co amidinate compound. In some embodiments the Co precursor is a Co beta-diketonate compound. In some embodiments the Co precursor contains at least one ketoimine ligand or a derivative thereof. In some embodiments the Co precursor contains at least one amidine ligand or a derivative thereof. In some embodiments the Co precursor contains at least one ketonate ligand or a derivative thereof. In some embodiments the Co precursor is Co$_2$(CO)$_8$, CCTBA, CoCp$_2$, Co(Cp-amd), Co(Cp(CO)$_2$), tBu-AllylCo(CO)$_3$ or Co(HMDS)$_2$.

In some embodiments, exposing the substrate to the non-halogen containing metal precursor may comprise pulsing the metal precursor (e.g., the Cu(dmap)$_2$) over the substrate for a time period of between about 0.01 seconds and about 60 seconds, between about 0.05 seconds and about 10.0 seconds, between about 0.1 seconds and about 5.0 seconds. In addition, during the pulsing of the metal precursor over the substrate the flow rate of the metal precursor may be less than 2000 sccm, or less than 1000 sccm, or less than 500 sccm, or less than 200 sccm or even less than 100 sccm.

Excess metal precursor and reaction byproducts (if any) may be removed from the substrate surface, e.g., by purging with an inert gas. For example, in some embodiments of the disclosure the methods may include a purge cycle wherein the substrate surface is purged for time period of less than approximately 1.0 seconds. Excess metal precursor and any reaction byproducts may be removed with the aid of a vacuum generated by a pumping system.

In a second phase of the deposition cycle ("substituted hydrazine phase"), the substrate is contacted with a second vapor phase reactant comprising a hydrocarbon substituted hydrazine precursor. In some embodiments of the disclosure, methods may further comprise selecting the substituted hydrazine to comprise an alkyl group with at least four (4) carbon atoms, wherein "alkyl group" refers to a saturated or unsaturated hydrocarbon chain of at least four (4) carbon atoms in length, such as, but not limited to, butyl, pentyl, hexyl, heptyl and octyl and isomers thereof, such as n-, iso-, sec- and tert-isomers of those. The alkyl group may be straight chain or branched-chain and may embrace all structural isomer forms of the alkyl group. In some embodiments the alkyl chain might be substituted. In some embodiments of the disclosure, the alkyl-hydrazine may comprise at least one hydrogen bonded to nitrogen. In some embodiments of the disclosure, the alkyl-hydrazine may comprise at least two hydrogens bonded to nitrogen. In some embodiments of the disclosure, the alkyl-hydrazine may comprise at least one hydrogen bonded to nitrogen and at least one alkyl chain bonded to nitrogen. In some embodiments of the disclosure, the second reactant may comprise an alkyl-hydrazine and may further comprise one or more of tertbutylhydrazine (C$_4$H$_9$N$_2$H$_3$), dimethylhydrazine or diethylhydrazine. In some embodiments of the disclosure, the substituted hydrazine has at least one hydrocarbon group attached to nitrogen. In some embodiments of the disclosure, the substituted hydrazine has at least two hydrocarbon groups attached to nitrogen. In some embodiments of the disclosure, the substituted hydrazine has at least three hydrocarbon groups attached to nitrogen. In some embodiments of the disclosure, the substituted hydrazine has at least one C1-C3 hydrocarbon group attached to nitrogen. In some embodiments of the disclosure, the substituted hydrazine has at least one C4-C10 hydrocarbon group attached to nitrogen. In some embodiments of the disclosure, the substituted hydrazine has linear, branched or cyclic or aromatic hydrocarbon group attached to nitrogen. In some embodiments of the disclosure the substituted hydrazine comprises substituted hydrocarbon group attached to nitrogen.

In some embodiments of the disclosure, the substituted hydrazine has the following formula:

$$R^I R^{II}\text{—}N\text{—}NR^{III}R^{IV}, \quad (1)$$

Wherein $R^I$ can be selected from hydrocarbon group, such as linear, branched, cyclic, aromatic or substituted hydrocarbon group and each of the $R^{II}$, $R^{III}$, $R^{IV}$ groups can be independently selected to be hydrogen or hydrocarbon groups, such as linear, branched, cyclic, aromatic or substituted hydrocarbon group.

In some embodiments in the formula (1) each of the $R^I$, $R^{II}$, $R^{III}$, $R^{IV}$ can be C1-C10 hydrocarbon, C1-C3 hydrocarbon, C4-C10 hydrocarbon or hydrogen, such as linear, branched, cyclic, aromatic or substituted hydrocarbon group. In some embodiments at least one of the $R^I$, $R^{II}$, $R^{III}$, $R^{IV}$ groups comprises aromatic group such as phenyl group. In some embodiments at least one of the $R^I$, $R^{II}$, $R^{III}$, $R^{IV}$ groups comprises methyl, ethyl, n-propyl, i-propyl, n-butyl, i-butyl, s-butyl, tertbutyl group or phenyl group. In some embodiments at least two of the each $R^I$, $R^{II}$, $R^{III}$, $R^{IV}$ groups can be independently selected to comprise methyl, ethyl, n-propyl, i-propyl, n-butyl, i-butyl, s-butyl, tertbutyl group or phenyl group. In some embodiments $R^{II}$, $R^{III}$ and $R^{IV}$ groups are hydrogen. In some embodiments at least two one of the $R^{II}$, $R^{III}$, $R^{IV}$ groups are hydrogen. In some embodiments at least one of the $R^{II}$, $R^{III}$, $R^{IV}$ groups are hydrogen. In some embodiments all of the $R^{II}$, $R^{III}$, $R^{IV}$ groups are hydrocarbons.

In some embodiments, exposing the substrate to the substituted hydrazine precursor may comprise pulsing the substituted hydrazine precursor (e.g., tertbutylhydrazine) over the substrate for a time period of between 0.1 seconds and 2.0 seconds or from about 0.01 seconds to about 10 seconds or less than about 20 seconds, less than about 10 seconds or less than about 5 seconds. During the pulsing of the substituted hydrazine precursor over the substrate the flow rate of the substituted hydrazine precursor may be less than 2000 sccm, or less than 1000 sccm, or less than 500 sccm, or even less than 100 sccm.

The second vapor phase reactant comprising an substituted hydrazine precursor may react with the metal-containing molecules left on the substrate surface. In some embodiments, the second phase substituted hydrazine precursor may comprise a reducing agent capable of reducing the metal-containing molecules left on the substrate surface to thereby form a metallic film. For example, the first vapor phase reactant may comprise a copper precursor and the second vapor phase reactant may comprise a reducing agent. After the copper precursor is introduced into the reaction chamber and adsorb onto a substrate surface, the excess copper precursor vapor may be pumped or purged from the chamber. This process is followed by the introduction of a reducing agent that reacts with the copper precursor on the substrate surface to form a copper metal and a free form of the ligand. This deposition cycle can be repeated if needed to achieve the desired thickness of the metallic film.

Excess second source chemical and reaction byproducts, if any, may be removed from the substrate surface, for example by a purging gas pulse and/or vacuum generated by a pumping system. Purging gas is preferably any inert gas, such as, without limitation, argon (Ar), nitrogen ($N_2$) or helium (He). A phase is generally considered to immediately follow another phase if a purge (i.e., purging gas pulse) or other reactant removal step intervenes.

The deposition cycle in which the substrate is alternatively contacted with the first vapor phase reactant (i.e., the non-halogen containing metal precursor) and the second vapor phase reactant (i.e., the substituted hydrazine precursor) may be repeated two or more times until a desired thickness of a metallic film is deposited. It should be appreciated that in some embodiments of the disclosure the order of the contacting of the substrate with the first vapor phase reactant and the second phase reactant may be such that the substrate is first contacted with the second vapor phase reactant followed by the first vapor phase reactant. In addition in some embodiments the cyclical deposition process may comprise contacting the substrate with the first vapor phase reactant one or more times prior to contacting the substrate with the second vapor phase reactant one or more times and similarly may alternatively comprise contacting the substrate with the second vapor phase reactant one or more times prior to contacting the substrate with the first vapor phase reactant one or more times. In addition, some embodiments of the disclosure may comprise selecting the first vapor phase reactant and the second vapor phase reactant to comprise non-plasma reactants, e.g., the first and second vapor phase reactants are substantially free of ionized reactive species. In some embodiments the first and second vapor phase reactants are substantially free of ionized reactive species, excited species or radical species. For example, both the first vapor phase reactant and the second vapor phase reactant may comprise non-plasma reactants to prevent ionization damage of the underlying substrate and the associated defects.

The cyclical deposition processes described herein, utilizing a non-halogen containing metal precursor and a substituted hydrazine precursor to form a metallic film, may be performed in an ALD or CVD deposition system with a heated substrate. For example, in some embodiments, methods may comprise heating the substrate to temperature of between approximately 80° C. and approximately 140° C., or even heating the substrate to a temperature of between approximately 80° C. and approximately 120° C. Of course, the appropriate temperature window for any given cyclical deposition process, such as, for an ALD reaction, will depend upon the surface termination and reactant species involved. Here, the temperature varies depending on the precursors being used and is generally at or below about 700° C., in some embodiments the deposition temperature is generally at or above about 100° C. for vapor deposition processes, in some embodiments the deposition temperature is between about 100° C. and about 250° C., and in some embodiments the deposition temperature is between about 120° C. and about 200° C. In some embodiments the deposition temperature is below about 500° C., below about 400° C. or below about 300° C. In some instances the deposition temperature can be below about 200° C., below about 150° C. or below about 100° C., for example, if additional reactants or reducing agents, such as ones reactants or reducing agents comprising hydrogen, are used in the process. In some instances the deposition temperature can be above about 20° C., above about 50° C. and above about 75° C.

Thin films comprising a metallic film deposited according to some of the embodiments described herein may be continuous thin films comprising a metallic film. In some embodiments the thin films comprising a metallic film deposited according to some of the embodiments described herein may be continuous at a thickness below about 100 nm, below about 60 nm, below about 50 nm, below about 40 nm, below about 30 nm, below about 25 nm, or below about 20 nm or below about 15 nm or below about 10 nm or below about 5 nm or lower. The continuity referred to herein can be physically continuity or electrical continuity. In some embodiments the thickness at which a film may be physically continuous may not be the same as the thickness at which a film is electrically continuous, and the thickness at which a film may be electrically continuous may not be the same as the thickness at which a film is physically continuous.

While in some embodiments a thin film comprising a metallic film deposited according to some of the embodiments described herein may be continuous, in some embodiments it may be desirable to form a non-continuous thin film comprising a metallic film, or a thin film comprising separate islands or nanoparticles comprising a metallic film. In some embodiments the deposited thin film comprising a metallic film may comprise nanoparticles comprising copper, nickel or cobalt that are not substantially physically or electrically continuous with one another. In some embodiments the deposited thin film comprising a metallic film may comprise separate nanoparticles, or separate islands, comprising a metallic film.

In some embodiments a thin film comprising a metallic film deposited according to some of the embodiments described herein may have an electrical resistivity of less than about 20 $\mu\Omega$/cm at a thickness of less than about 100 nm. In some embodiments a thin film comprising a metallic film deposited according to some of the embodiments described herein may have an electrical resistivity of less than about 20 $\mu\Omega$/cm at a thickness of below about 60 nm, below about 50 nm, below about 40 nm, below about 30 nm, below about 25 nm, or below about 20 nm or lower. In some embodiments a thin film comprising a metallic film deposited according to some of the embodiments described herein may have an electrical resistivity of less than about 15 $\mu\Omega$/cm at a thickness of below about 60 nm, below about 50 nm, below about 40 nm, below about 30 nm, below about 25 nm, or below about 20 nm or lower. In some embodiments a thin film comprising a metallic film deposited according to some of the embodiments described herein may have an electrical resistivity of less than about 10 $\mu\Omega$/cm at a thickness of below about 60 nm, below about 50 nm, below about 40 nm, below about 30 nm, below about 25 nm, or below about 20 nm or lower.

In some embodiments a thin film comprising metallic film deposited according to some of the embodiments described herein may have an electrical resistivity of less than about 200 $\mu\Omega$cm at a thickness of below about 30 nm, below about 20 nm, below about 15 nm, below about 10 nm, below about 8 nm, or below about 5 nm or lower.

In some embodiments a metallic thin film deposited according to some of the embodiments described herein may have an electrical resistivity of less than about 200 $\mu\Omega$cm, less than about 100 $\mu\Omega$cm, less than about 50 $\mu\Omega$cm, less than about 30 $\mu\Omega$cm, less than about 20 $\mu\Omega$cm, less than about 18 $\mu\Omega$cm, less than about 15 $\mu\Omega$cm, less than about 12 $\mu\Omega$cm, less than about 10 $\mu\Omega$cm or less than about 8 $\mu\Omega$cm at a thickness of less than about 100 nm.

In some embodiments a thin film comprising copper deposited according to some of the embodiments described herein may have an electrical resistivity of less than about 200 $\mu\Omega$cm, less than about 100 $\mu\Omega$cm, less than about 50

µΩcm, less than about 30 µΩcm, less than about 20 µΩcm, less than about 18 µΩcm, less than about 15 µΩcm, less than about 12 µΩcm, less than about 10 µΩcm, less than about 8 µΩcm, or less than about 5 µΩcm or lower at a thickness of less than about 100 nm. In some embodiments a thin film comprising copper deposited according to some of the embodiments described herein may have an electrical resistivity of less than about 20 µΩcm, less than about 18 µΩcm, less than about 15 µΩcm, less than about 12 µΩcm, less than about 10 µΩcm, less than about 8 µΩcm, or less than about 5 µΩcm or lower at a thickness of less than about 50 nm. In some embodiments of the disclosure, forming the metallic film (e.g., the copper film) may comprise forming the metallic film to have an electrical resistivity of less than approximately 4µΩ-cm, or an electrical resistivity of less than 3µΩ-cm, or even an electrical resistivity of less than 2µΩ-cm. As a non-limiting example, a copper film may be formed by the methods of the disclosure to a thickness of approximately 50 nanometers with an electrical resistivity of approximately 1.92 µΩ-cm.

In some embodiments a thin film comprising nickel or cobalt deposited according to some of the embodiments described herein may have an electrical resistivity of less than about 200 µΩcm, less than about 100 µΩcm, less than about 50 µΩcm, less than about 30 µΩcm, less than about 20 µΩcm, less than about 18 µΩcm, less than about 15 µΩcm, less than about 12 µΩcm, less than about 10 µΩcm or less than about 8 µΩcm, at a thickness of less than about 100 nm. In some embodiments a thin film comprising nickel or cobalt deposited according to some of the embodiments described herein may have an electrical resistivity of less than about 20 µΩcm, less than about 18 µΩcm, less than about 15 µΩcm, less than about 12 µΩcm, less than about 10 µΩcm, less than about 8 µΩcm at a thickness of less than about 50 nm.

In some embodiments a thin film comprising copper, nickel or cobalt deposited according to some of the embodiments described herein may be crystalline or polycrystalline. In some embodiments a thin film comprising copper, nickel or cobalt deposited according to some of the embodiments described herein may have a cubic crystal structure. In some embodiments a thin film comprising copper, nickel or cobalt deposited according to some of the embodiments described herein may have a thickness from about 20 nm to about 100 nm. In some embodiments a thin film comprising copper, nickel or cobalt deposited according to some of the embodiments described herein may have a thickness from about 20 nm to about 60 nm. In some embodiments a thin film comprising copper, nickel or cobalt deposited according to some of the embodiments described herein may have a thickness greater than about 20, greater than about 30 nm, greater than about 40 nm, greater than about 50 nm, greater than about 60 nm, greater than about 100 nm, greater than about 250 nm, greater than about 500 nm, or greater. In some embodiments a thin film comprising copper, nickel or cobalt deposited according to some of the embodiments described herein may have a thickness of less than about 50 nm, less than about 30 nm, less than about 20 nm, less than about 15 nm, less than about 10 nm, less than about 5 nm or in some instances the amount of copper, nickel or cobalt corresponds to thickness of less than about 5 nm, less than about 3 nm, less than about 2 nm or less than about 1 nm, for example, if a non-continuous film or separate particles or islands comprising copper, nickel or cobalt are desired.

In some embodiments the growth rate of the metallic film is from about 0.005 Å/cycle to about 5 Å/cycle, from about 0.01 Å/cycle to about 2.0 Å/cycle. In some embodiments the growth rate of the film is more than about 0.05 Å/cycle, more than about 0.1 Å/cycle, more than about 0.15 Å/cycle, more than about 0.20 Å/cycle, more than about 0.25 Å/cycle or more than about 0.3 Å/cycle. In some embodiments the growth rate of the film is less than about 2.0 Å/cycle, less than about 1.0 Å/cycle, less than about 0.75 Å/cycle, less than about 0.5 Å/cycle or less than about 0.3 Å/cycle.

Figure 4:
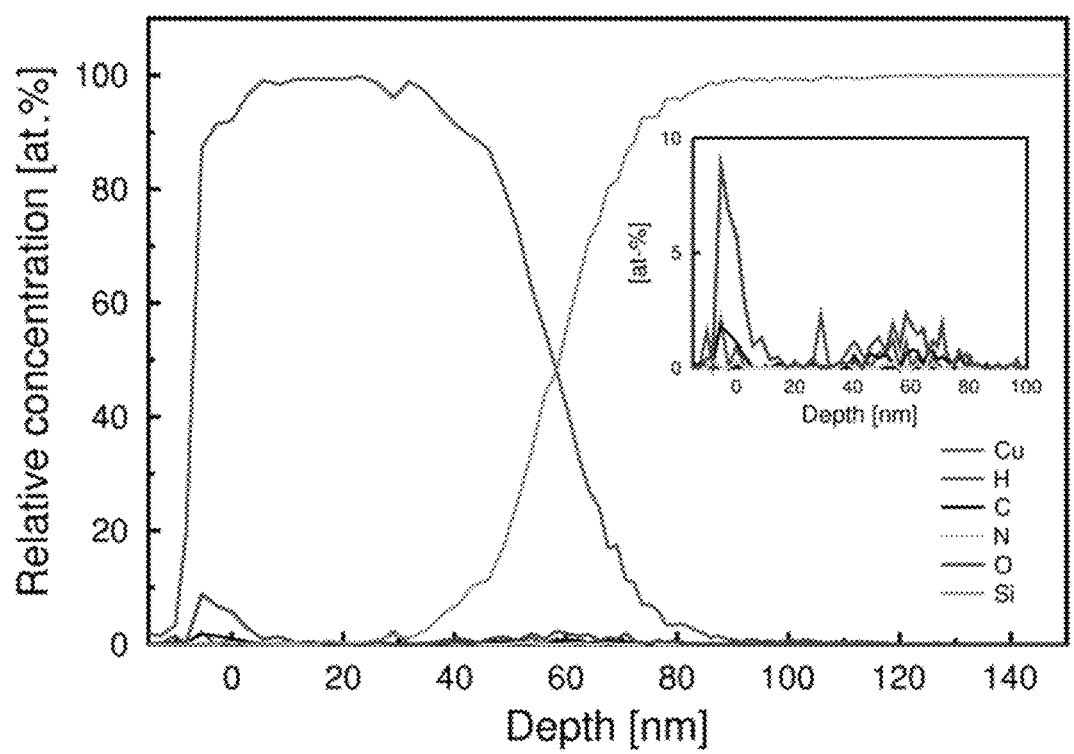
FIG. 4 is a graph showing time-of-flight elastic recoil detection analysis (TOF-ERDA) of a copper film formed according to the embodiments of the disclosure.

In some embodiments a thin film comprising copper, nickel or cobalt may comprise less than about 20 at-%, less than about 10 at-%, less than about 7 at-%, less than about 5 at-%, less than about 3 at-%, less than about 2 at-%, or less than about 1 at-% of impurities, that is, elements other than Cu, Ni or Co or the metal of desired metallic film. In some embodiments the thin film comprising copper, nickel or cobalt comprise less than about 20 at-%, less than about 10 at-%, less than about 5 at-%, less than about 2 at-%, or less than about 1 at-% of hydrogen. In some embodiments the thin film comprising copper, nickel or cobalt may comprise less than about 10 at-%, less than about 5 at-%, less than about 2 at-%, less than about 1 at-% or less than about 0.5 at-% of carbon. In some embodiments the thin film comprising copper, nickel or cobalt may comprise less than about 5 at-%, less than about 2 at-%, less than about 1 at-%, less than about 0.5 at-%, or less than about 0.2 at-% of nitrogen. In some embodiments the thin film comprising copper, nickel or cobalt may comprise less than about 15 at-%, less than about 10 at-%, less than about 5 at-%, less than about 3 at-%, less than about 2 at-%, or less than about 1 at-% of oxygen. In some embodiments the thin film comprising copper, nickel or cobalt may comprise less than about 30 at-%, less than about 20 at-%, less than about 20 at-%, less than about 5 at-%, or less than about 3 at-% of oxygen on average at the surface of the said copper, nickel or cobalt, wherein the surface can be understood to be thickness of less than about 20 nm from the top most surface. In some embodiments the thin film comprising copper, nickel or cobalt may comprise stoichiometric or non-stoichiometric copper oxide, nickel oxide or cobalt oxide near the topmost surface of the material. In some embodiments the thin film comprising copper, nickel or cobalt may comprise more than about 80 at-%, more than about 90 at-%, more than about 93 at-%, more than about 95 at-%, more than about 97 at-%, or more than about 99 at-% copper, nickel or cobalt. As a non-limiting example, FIG. 4 illustrates a graph showing time-of-flight elastic recoil detection analysis (TOF-ERDA) of a copper film formed according to the embodiments of the disclosure.

The metallic films formed by the embodiments of the disclosure may comprise one of copper, cobalt and nickel. In some embodiments of the disclosure the metallic film formed may consist essentially of one of copper, cobalt and nickel. For example, as a non-limiting example embodiment, the metallic films formed by the methods of the disclosure may comprise copper having an elemental composition of copper greater than 95.0 atomic %, or greater than 97.0 atomic %, or greater than 98.0 atomic %, or greater than 99.0 atomic %, or even greater than 99.5 atomic %. In some embodiments the copper surface might be oxidized and the values above represent the bulk film values without surface oxidation. In the embodiments outlined herein, the atomic concentration of an element may be determined utilizing Rutherford backscattering (RBS) or Time-of-Flight Elastic Recoil Detection Analysis (TOF-ERDA). In case some other methods are used, such as x-ray photoelectron spectroscopy (XPS), the atomic concentrations may vary In some embodiments the thin films comprising copper, nickel or cobalt may be deposited on a three-dimensional structure. In some embodiments the step coverage of the thin film comprising copper, nickel or cobalt may be equal to or greater than about 50%, greater than about 80%, greater than about 90%, about 95%, about 98% or about 99% or greater in structures having aspect ratios (height/width) of more than about 2, more than about 5, more than about 10, more than about 25, more than about 50 or more than about 100.

In some embodiments of the disclosure the metallic films formed by the methods described herein may have desired crystallographic properties. For example, as a non-limiting example embodiment, the metallic film may consist essentially of copper and the copper film may comprise a cubic crystalline structure with a predominant (111) crystallographic orientation. In more detail, FIG. 1 is a graph showing the 2 theta x-ray diffraction (XRD) scans of non-limiting example metallic copper films formed by ALD process of the current disclosure utilizing a non-halogen containing metal precursor and an alkyl-hydrazine precursor at various deposition temperatures. For example, the XRD scan denoted by the label 100 is taken from a copper film formed by ALD utilizing $Cu(dmap)_2$ and tertbutylhydrazine at a substrate temperature of 140° C. The XRD scan denoted by label 100 indicates that the copper film, formed by the methods of the disclosure may comprise a number of crystallographic orientations including (111) and (200) with the (111) crystallographic orientation being predominant. Therefore, in some embodiments of the disclosure, the metallic film, formed by the ALD processes described herein, comprises a (111) crystallographic orientation and in some embodiments the metallic film comprises a predominant (111) crystallographic orientation.

In some embodiments the deposited thin film comprising metallic film may be subjected to a treatment process after deposition. In some embodiments this treatment process may, for example, enhance the conductivity or continuity of the deposited thin film comprising a metallic film. In some embodiments a treatment process may comprise, for example an anneal process. In some embodiments the thin film comprising a metallic film may be annealed in an atmosphere comprising vacuum or one or more annealing gases, for example a reducing gas such as reducing gas comprising hydrogen. In some embodiments the metallic film may comprise nitrogen and anneal/treatment in vacuum or anneal gas, such as in reducing gas, at elevated temperatures, for example at metallic film deposition reaction temperature, may reduce the nitrogen or almost fully remove the nitrogen from the metallic film. In some embodiments the treatment with reducing gas is applied every cycle, every $n^{th}$ cycle, wherein n can be more than 1, 2, 3, 4, 9, 19, 49 or 99 cycles or after the metallic film deposition as a post-treatment. The metallic film comprising nitrogen before the treatment may comprise nitrogen less than about 60 at-%, less than about 50 at-%, less than about 40 at-%, less than about 30 at-%, less than about 20 at-%, less than about 10 at-%, or less than about 5 at-%. In some embodiments the metallic film after the treatment may comprise less than about 20 at-%, less than about 10 at-%, less than about 5 at-%, less than about 2 at-%, less than about 1 at-%, less than about 0.5 at-%, or less than about 0.2 at-% of nitrogen.

The metallic films formed by the cyclical deposition processes disclosed herein can be utilized in a variety of contexts, such as in the formation of semiconductor device structures.

One of skill in the art will recognize that the processes described herein are applicable to many contexts, including fabrication of transistors including planar devices as well as multiple gate transistors, such as FinFETs.

Figure 2:
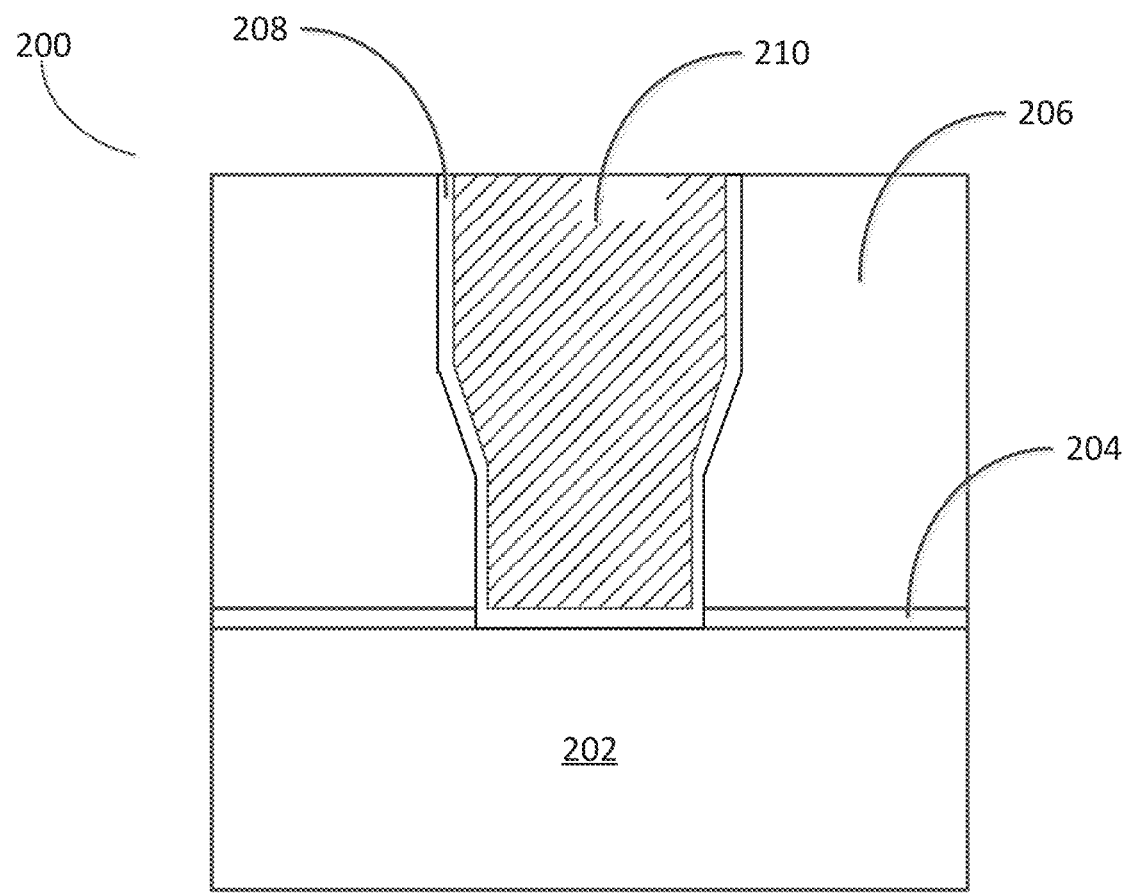
FIG. 2 is simplified cross section view of a semiconductor device structure formed according to the embodiments of the disclosure.

As a non-limiting example, and with reference to FIG. 2, a semiconductor device structure 200 may comprise a interconnection structure which may include a substrate 202, a barrier layer 204, a dielectric layer 206, a seed layer 208 and a fill layer 210. According to the teaching of the present disclosure, the seed layer 208 may comprise a metallic film, such as a metallic copper film, formed by the cyclical deposition processes as described herein.

In more detail, the semiconductor device structure 200 may comprise a substrate 202 wherein the substrate 202 may comprise a silicon material including device circuit components (not shown) formed in the substrate 202. The barrier layer 204 may comprise an etch stop layer, such as a silicon carbide, silicon nitride, silicon oxycarbide and a silicon oxynitride. The dielectric layer 206 may comprise interlayer dielectric materials such as silicon dioxides, silicon nitrides, polymer based materials and carbon rich dielectrics.

In some embodiments of the disclosure, the semiconductor device structure 200 may comprise a seed layer 208 wherein the seed layer consists essentially of copper formed by the cyclical deposition processes as described herein. The seed layer may be formed to a thickness of less than approximately 20 nanometers, or less than approximately 10 nanometers, or even less than approximately 5 nanometers. In addition the seed layer may be formed to have an electrical resistivity of less than approximately 50 µΩ-cm, less than approximately 20 µΩ-cm, less than approximately 10 µΩ-cm, less than approximately 5µΩ-cm, less than approximately 4µΩ-cm, or an electrical resistivity of less than 3µΩ-cm, or even an electrical resistivity of less than 2µΩ-cm.

Figure 3:
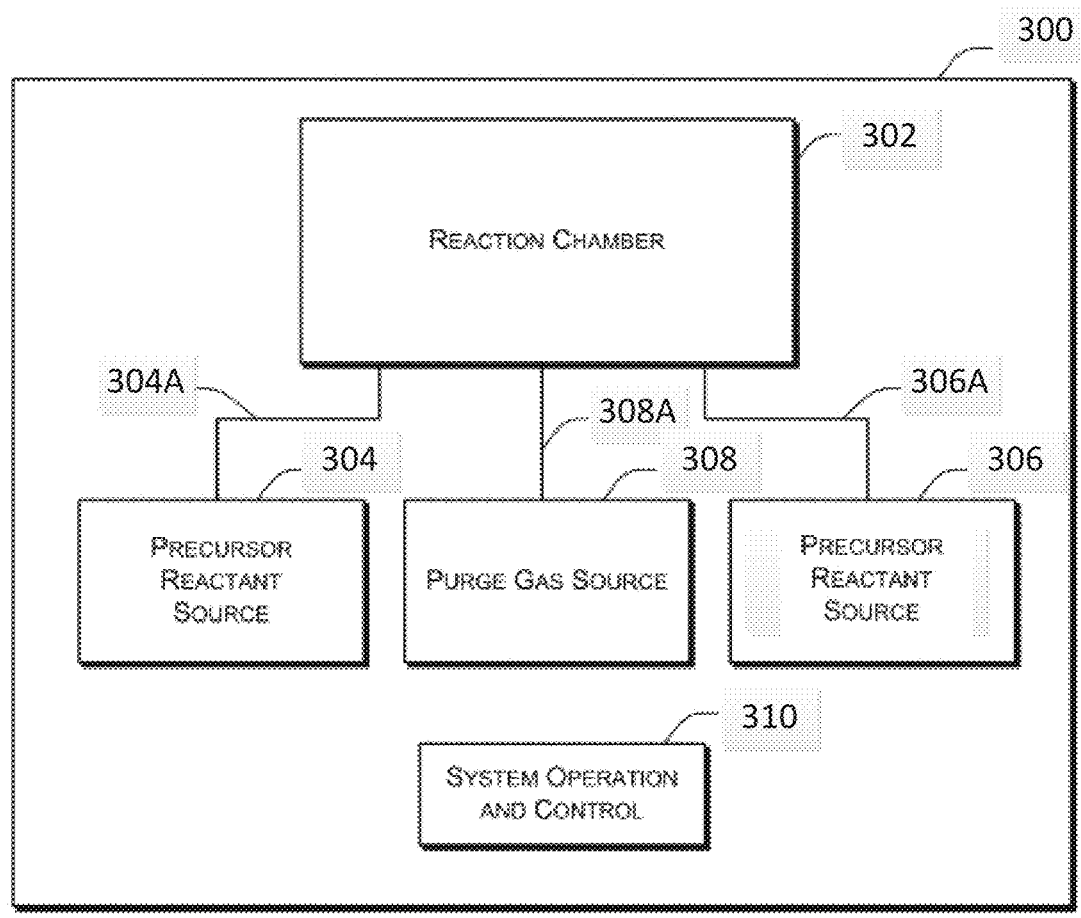
FIG. 3 illustrated a reaction system configured to perform certain embodiments of the disclosure.

Embodiments of the disclosure may also include a reaction system configured for forming the metallic films of the present disclosure. In more detail, FIG. 3 schematically illustrates a reaction system 300 including a reaction chamber 302 that further includes mechanism for retaining a substrate (not shown) under predetermined pressure, temperature, and ambient conditions, and for selectively exposing the substrate to various gases. A precursor reactant source 304 may be coupled by conduits or other appropriate means 304A to the reaction chamber 302, and may further couple to a manifold, valve control system, mass flow control system, or mechanism to control a gaseous precursor originating from the precursor reactant source 304. A precursor (not shown) supplied by the precursor reactant source 304, the reactant (not shown), may be liquid or solid under room temperature and standard atmospheric pressure conditions. Such a precursor may be vaporized within a reactant source vacuum vessel, which may be maintained at or above a vaporizing temperature within a precursor source chamber. In such embodiments, the vaporized precursor may be transported with a carrier gas (e.g., an inactive or inert gas) and then fed into the reaction chamber 302 through conduit 304A. In other embodiments, the precursor may be a vapor under standard conditions. In such embodiments, the precursor does not need to be vaporized and may not require a carrier gas. For example, in one embodiment the precursor may be stored in a gas cylinder. The reaction system 300 may also include additional precursor reactant sources, such precursor reactant source 306 which may also be couple to the reaction chamber by conduits 306A as described above.

A purge gas source 308 may also be coupled to the reaction chamber 302 via conduits 308A, and selectively supplies various inert or noble gases to the reaction chamber 302 to assist with the removal of precursor gas or waste gasses from the reaction chamber. The various inert or noble gasses that may be supplied may originate from a solid, liquid or stored gaseous form.

The reaction system 300 of FIG. 3, may also comprise a system operation and control mechanism 310 that provides electronic circuitry and mechanical components to selectively operate valves, manifolds, pumps and other equipment included in the reaction system 300. Such circuitry and components operate to introduce precursors, purge gasses from the respective precursor sources 304, 306 and purge gas source 308. The system operation and control mechanism 310 also controls timing of gas pulse sequences, temperature of the substrate and reaction chamber, and pressure of the reaction chamber and various other operations necessary to provide proper operation of the reaction system 300. The operation and control mechanism 310 can include control software and electrically or pneumatically controlled valves to control flow of precursors, reactants and purge gasses into and out of the reaction chamber 302. The control system can include modules such as a software or hardware component, e.g., a FPGA or ASIC, which performs certain tasks. A module can advantageously be configured to reside on the addressable storage medium of the control system and be configured to execute one or more processes.

Those of skill in the relevant arts appreciate that other configurations of the present reaction system are possible, including different number and kind of precursor reactant sources and purge gas sources. Further, such persons will also appreciate that there are many arrangements of valves, conduits, precursor sources, purge gas sources that may be used to accomplish the goal of selectively feeding gasses into reaction chamber 302. Further, as a schematic representation of a reaction system, many components have been omitted for simplicity of illustration, and such components may include, for example, various valves, manifolds, purifiers, heaters, containers, vents, and/or bypasses.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

What is claimed is:

1. A method for forming a metallic film on a substrate by cyclical deposition, the method comprising:
    contacting the substrate with a first reactant comprising a non-halogen containing metal precursor comprising at least one of copper, nickel or cobalt, wherein the non-halogen containing metal precursor comprises at least one ligand bonded to a metal atom through at least one oxygen atom and at least one nitrogen atom; and
    contacting the substrate with a second reactant comprising a hydrocarbon substituted hydrazine precursor;
    wherein the metallic film is formed in response to contacting the substrate with the first reactant and the second reactant;
    wherein the step of contacting the substrate with the second reactant immediately follows the step of contacting the substrate with the first reactant or immediately follows an intervening purge following the step of contacting the substrate with the first reactant.

2. The method of claim 1, wherein the cyclical deposition comprises atomic layer deposition.

3. The method of claim 1, wherein the cyclical deposition comprises cyclical chemical vapor deposition.

4. The method of claim 1, further comprising selecting the substituted hydrocarbon hydrazine precursor to comprise a C1-C10 hydrocarbon group.

5. The method of claim 1, further comprising selecting the substituted hydrocarbon hydrazine precursor to comprise an aromatic hydrocarbon group.

6. The method of claim 1, wherein the hydrocarbon substituted hydrazine precursor comprises a branch-chained allyl group or sec- or tert-isomer of alkyl group of at least four carbon atoms.

7. The method of claim 6, further comprising selecting the alkyl group to comprise at least one of a methyl, an ethyl or a tertbutyl alkyl group.

8. The method of claim 1, further comprising selecting the non-halogen containing metal precursor to comprise at least one bidentate ligand.

9. The method of claim 1, further comprising selecting the non-halogen containing metal precursor to comprise at least two non-halogen containing ligands.

10. The method of claim 1, further comprising selecting the non-halogen containing metal precursor to comprise at least one of $Cu(dmap)_2$, $Ni(dmap)_2$ or $Co(dmap)_2$.

11. The method of claim 1, wherein the method comprises at least one deposition cycle in which the substrate is alternately and sequentially contacted with the first reactant and the second reactant.

12. The method of claim 1, further comprising selecting the first reactant and the second reactant to comprise non-plasma reactants.

13. A reaction system configured to perform the method of claim 1.

14. A semiconductor device structure comprising at least a portion of a metallic interconnect formed by the method of claim 1.

15. A method for forming a metallic film on a substrate by cyclical deposition, the method comprising:
    contacting the substrate with a first reactant comprising a non-halogen containing metal precursor comprising at least one of copper, nickel or cobalt, wherein the non-halogen containing metal precursor comprises at least one ligand bonded to a metal atom through at least one oxygen atom or at least one nitrogen atom; and
    contacting the substrate with a second reactant comprising a hydrocarbon substituted hydrazine precursor;
    wherein the metallic film is formed in response to contacting the substrate with the first reactant and the second reactant;
    wherein the step of contacting the substrate with the second reactant immediately follows the step of contacting the substrate with the first reactant or immediately follows an intervening purge following the step of contacting the substrate with the first reactant.

16. The method of claim 15, wherein the non-halogen containing metal precursor comprises at least one ligand bonded to a metal atom through at least one oxygen atom.

17. The method of claim 15, wherein the non-halogen containing metal precursor comprises at least one ligand bonded to a metal atom through at least one nitrogen atom.

18. The method of claim 15, wherein the hydrocarbon substituted hydrazine precursor comprises a branch-chained allyl group or sec- or tert-isomer of alkyl group of at least four carbon atoms.

19. The method of claim 15, wherein the non-halogen containing metal precursor comprises at least one bidentate ligand.

\* \* \* \* \*